United States Patent
Weingarten et al.

(10) Patent No.: US 8,365,040 B2
(45) Date of Patent: Jan. 29, 2013

(54) SYSTEMS AND METHODS FOR HANDLING IMMEDIATE DATA ERRORS IN FLASH MEMORY

(75) Inventors: Hanan Weingarten, Herzelia (IL); Shmuel Levy, Qiryat Tivon (IL)

(73) Assignee: Densbits Technologies Ltd., Haifa (IL)

( * ) Notice: Subject to any disclaimer, the term of this patent is extended or adjusted under 35 U.S.C. 154(b) by 626 days.

(21) Appl. No.: 12/596,439

(22) PCT Filed: Sep. 17, 2008

(86) PCT No.: PCT/IL2008/001237
§ 371 (c)(1),
(2), (4) Date: Oct. 18, 2009

(87) PCT Pub. No.: WO2009/095902
PCT Pub. Date: Aug. 6, 2009

(65) Prior Publication Data
US 2010/0122113 A1    May 13, 2010

Related U.S. Application Data

(60) Provisional application No. 61/006,806, filed on Jan. 31, 2008, provisional application No. 61/071,486, filed on May 1, 2008, provisional application No. 60/960,207, filed on Sep. 20, 2007, provisional application No. 61/071,467, filed on Apr. 30, 2008, (Continued)

(51) Int. Cl.
*G11C 29/00* (2006.01)
(52) U.S. Cl. ......... 714/763; 711/103; 714/6.11; 714/54; 714/746; 714/758
(58) Field of Classification Search .................. 711/103; 714/6, 54, 746, 758
See application file for complete search history.

(56) References Cited

U.S. PATENT DOCUMENTS

| | | | |
|---|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |

(Continued)

OTHER PUBLICATIONS

International Search Report and written opinion for Application No. PCT/IL2008/001237, dated Jan. 28, 2009.

(Continued)

*Primary Examiner* — Scott Baderman
*Assistant Examiner* — Jeison C Arcos
(74) *Attorney, Agent, or Firm* — SNR Denton US LLP

(57) ABSTRACT

A flash memory system comprising temporary memory, writing apparatus for writing first logical data from the temporary memory into flash memory cells having at least two levels, thereby to generate a physical representation of the first logical data including known errors, reading apparatus for reading the physical representation from the cells, thereby to generate, and store in the temporary memory, second logical data which if read immediately is identical to the first logical data other than the known errors; and controlling apparatus controlling the writing apparatus and the reading apparatus and including known error ID apparatus operative to identify the known errors by comparing the first logical data to second logical data read immediately after the physical representation is generated, to store information characterizing the known errors and to use the information, when the second logical data is next read, to correct the known errors.

16 Claims, 11 Drawing Sheets

Related U.S. Application Data provisional application No. 60/960,943, filed on Oct. 22, 2007, provisional application No. 61/071,469, filed on Apr. 30, 2008, provisional application No. 60/996,027, filed on Oct. 25, 2007, provisional application No. 61/071,466, filed on Apr. 30, 2008, provisional application No. 61/006,120, filed on Dec. 19, 2007, provisional application No. 61/071,464, filed on Apr. 30, 2008, provisional application No. 61/006,385, filed on Jan. 10, 2008, provisional application No. 61/064,995, filed on Apr. 8, 2008, provisional application No. 60/996,948, filed on Dec. 12, 2007, provisional application No. 61/071,487, filed on May 1, 2008, provisional application No. 61/071,468, filed on Apr. 30, 2008, provisional application No. 60/996,782, filed on Dec. 5, 2007, provisional application No. 61/064,853, filed on Mar. 31, 2008, provisional application No. 61/129,608, filed on Jul. 8, 2008, provisional application No. 61/006,078, filed on Dec. 18, 2007, provisional application No. 61/064,923, filed on Apr. 30, 2008, provisional application No. 61/006,805, filed on Jan. 31, 2008, provisional application No. 61/071,465, filed on Apr. 30, 2008, provisional application No. 61/064,760, filed on Mar. 25, 2008, provisional application No. 61/071,404, filed on Apr. 28, 2008, provisional application No. 61/136,234, filed on Aug. 20, 2008, provisional application No. 61/129,414, filed on Jun. 25, 2008.

U.S. PATENT DOCUMENTS

| Patent No. | Date | Inventor |
|---|---|---|
| 5,926,409 A | 7/1999 | Engh et al. |
| 5,956,268 A | 9/1999 | Lee |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2001/0034815 A1* | 10/2001 | Dugan et al. ................ 711/118 |
| 2002/0063774 A1* | 5/2002 | Hillis et al. ................ 348/14.01 |
| 2002/0085419 A1* | 7/2002 | Kwon et al. ................ 365/185.17 |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1* | 2/2004 | Tanaka et al. ................ 714/718 |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1* | 8/2005 | Shibata et al. ................ 365/185.28 |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1* | 3/2006 | Oshima ................ 711/103 |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1* | 11/2007 | Shibata et al. ................ 365/185.03 |
| 2007/0263439 A1 | 11/2007 | Cornwell et al. |
| 2007/0266291 A1 | 11/2007 | Toda et al. |
| 2007/0271494 A1 | 11/2007 | Gorobets |

| | | |
|---|---|---|
| 2008/0010581 A1 | 1/2008 | Alrod et al. |
| 2008/0028014 A1 | 1/2008 | Hilt et al. |
| 2008/0055989 A1* | 3/2008 | Lee et al. .................. 365/185.09 |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1* | 5/2008 | Li et al. ......................... 717/126 |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1* | 5/2009 | Flynn et al. .................. 711/103 |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Serge Sawitzki, "High-Throughput and Low Power Architectures for Reed Solomon Decoder", (a.kumar at tue.nl, Eindhoven University of Technology and sergei.sawitzki at philips. com) 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, 2003.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.

T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.

Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.

Paulo Cappelletti, Clara Golla, Piero Olivo, Enrico Zanoni, "Flash Memories", Kluwer Academic Publishers, 1999.

Dempster, et al., "Maximum Likelihood from Incomplete Data via the EM Algorithm", Journal of the Royal Statistical Society. Series B (Methodological), vol. 39, No. 1 (1997), pp. 1-38.

Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.

Daneshbeh, "Bit Serial Systolic Architectures for Multiplicative Inversion and Division over GF (2)", A thesis presented to the University of Waterloo, Ontario, Canada, 2005, pp. 1-118.

Chen, Formulas for the solutions of Quadratic Equations over GF (2), IEEE Trans. Inform. Theory, vol. IT-28, No. 5, Sep. 1982, pp. 792-794.

Berlekamp et al., "On the Solution of Algebraic Equations over Finite Fields", Inform. Cont. 10, Oct. 1967, pp. 553-564.

\* cited by examiner

| Subsequence | 000 | 001 | 010 | 011 | 100 | 101 | 110 | 111 |
|---|---|---|---|---|---|---|---|---|
| Symbol | 0 | 1 | 2 | 3 | 4 | 5 | 6 | 7 |

| Subsequence | 111 | 110 | 100 | 101 | 001 | 000 | 010 | 011 |
|---|---|---|---|---|---|---|---|---|
| Symbol | 0 | 1 | 2 | 3 | 4 | 5 | 6 | 7 |

SYSTEMS AND METHODS FOR HANDLING IMMEDIATE DATA ERRORS IN FLASH MEMORY

CROSS-REFERENCE TO RELATED APPLICATIONS

This application is a National Phase Application of PCT International Application No. PCT/IL2008/001237, entitled "SYSTEMS AND METHODS FOR HANDLING IMMEDIATE DATA ERRORS IN FLASH MEMORY" International Filing Date Sep. 17, 2008, published on Aug. 6, 2009 as International Publication No. WO 2009/095902 A2, which in turn claims priority from U.S. Provisional Application No. 61/006,806, filed Jan. 31, 2008 a, U.S. Provisional Application No. 61/071,486, filed May 1, 2008, all of which are incorporated herein by reference in their entirety.

Other co-pending applications include: U.S. Provisional Application No. 60/960,207, filed Sep. 20, 2007 and entitled "Systems and Methods for Coupling Detection in Flash Memory", U.S. Provisional Application No. 61/071,467, filed Apr. 30, 2008 and entitled "Improved Systems and Methods for Determining Logical Values of Coupled Flash Memory Cells", U.S. Provisional Application No. 60/960,943, filed Oct. 22, 2007 and entitled "Systems and methods to reduce errors in Solid State Disks and Large Flash Devices" and U.S. Provisional Application No. 61/071,469, filed Apr. 30, 2008 and entitled "Systems and Methods for Averaging Error Rates in Non-Volatile Devices and Storage Systems", U.S. Provisional Application No. 60/996,027, filed Oct. 25, 2007 and entitled "Systems and Methods for Coping with Variable Bit Error Rates in Flash Devices", U.S. Provisional Application No. 61/071,466, filed Apr. 30, 2008 and entitled "Systems and Methods for Multiple Coding Rates in Flash Devices", U.S. Provisional Application No. 61/006,120, filed Dec. 19, 2007 and entitled "Systems and Methods for Coping with Multi Stage Decoding in Flash Devices", U.S. Provisional Application No. 61/071,464, filed Apr. 30, 2008 and entitled "A Decoder Operative to Effect A Plurality of Decoding Stages Upon Flash Memory Data and Methods Useful in Conjunction Therewith", U.S. Provisional Application No. 61/006,385, filed Jan. 10, 2008 and entitled "A System for Error Correction Encoder and Decoder Using the Lee Metric and Adapted to Work on Multi-Level Physical Media", U.S. Provisional Application No. 61/064,995, filed Apr. 8, 2008 and entitled "Systems and Methods for Error Correction and Decoding on Multi-Level Physical Media", U.S. Provisional Application No. 60/996,948, filed Dec. 12, 2007 and entitled "Low Power BCH/RS Decoding: a Low Power Chien-Search Implementation", U.S. Provisional Application No. 61/071,487, filed May 1, 2008 and entitled "Chien-Search System Employing a Clock-Gating Scheme to Save Power for Error Correction Decoder and other Applications", U.S. Provisional Application No. 61/071,468, filed Apr. 30, 2008 and entitled "A Low Power Chien-Search Based BCH/RS Recoding System for Flash Memory, Mobile Communications Devices and Other Applications", U.S. Provisional Application No. 60/996,782, filed Dec. 5, 2007 and entitled "Systems and Methods for Using a Training Sequence in Flash Memory", U.S. Provisional Application No. 61/064,853, filed Mar. 31, 2008 and entitled "Flash Memory Device with Physical Cell Value Deterioration Accommodation and Methods Useful in Conjunction Therewith", U.S. Provisional Application No. 61/129,608, filed Jul. 8, 2008 and entitled "A Method for Acquiring and Tracking Detection Thresholds in Flash Devices", U.S. Provisional Application No. 61/006,078, filed Dec. 18, 2007 and entitled "Systems and Methods for Multi Rate Coding in Multi Level Flash Devices", U.S. Provisional Application No. 61/064,923, filed Apr. 30, 2008 and entitled "Apparatus For Coding At A Plurality Of Rates In Multi-Level Flash Memory Systems, And Methods Useful In Conjunction Therewith", U.S. Provisional Application No. 61/006,805, filed Jan. 31, 2008 and entitled "A Method for Extending the Life of Flash Devices", U.S. Provisional Application No. 61/071,465, filed Apr. 30, 2008 and entitled "Systems and Methods for Temporarily Retiring Memory Portions", U.S. Provisional Application No. 61/064,760, filed Mar. 25, 2008 and entitled "Hardware efficient implementation of rounding in fixed-point arithmetic", U.S. Provisional Application No. 61/071,404, filed Apr. 28, 2008 and entitled "Apparatus and Methods for Hardware-Efficient Unbiased Rounding", U.S. Provisional Application No. 61/136,234, filed Aug. 20, 2008 and entitled "A Method Of Reprogramming A Non-Volatile Memory Device Without Performing An Erase Operation", U.S. Provisional Application No. 61/129,414, filed Jun. 25, 2008 and entitled "Improved Programming Speed in Flash Devices Using Adaptive Programming", and several other co-pending patent applications being filed concurrently (same day).

FIELD OF THE INVENTION

The present invention relates generally to methods and systems for managing computer memory and more particularly to methods and systems for managing flash memory.

BACKGROUND OF THE INVENTION

Conventional flash memory technology is described in the following publications inter alia:

[1] Paulo Cappelletti, Clara Golla, Piero Olivo, Enrico Zanoni, "Flash Memories", Kluwer Academic Publishers, 1999

[2] G. Campardo, R. Micheloni, D. Novosel, "CLSI-Design of Non-Volatile Memories", Springer Berlin Heidelberg N.Y., 2005

U.S. Pat. Nos. 5,771,346; 7,203,874; and Published United States Patent Application Nos. 2003231532; 2004243909; and 2007101184.

The disclosures of all publications and patent documents mentioned in the specification, and of the publications and patent documents cited therein directly or indirectly, are hereby incorporated by reference.

SUMMARY OF THE INVENTION

Today's Flash memory devices store information with high density on Flash cells with ever smaller dimensions. In addition, Multi-Level Cells (MLCs) store several bits per cell by differentially setting the amount of charge in the cell. The amount of charge is then measured by a detector, e.g. in the form of a threshold voltage of the transistor gate. Due to inaccuracies during the programming procedure and charge loss due to retention in memory and temperature, the measured levels during a Read operation suffer from detection errors. The small dimensions of the Flash cells result in cells that can store very small amounts of charge, enhancing the effects of inaccuracies due to randomness of programming, retention and previous erase/write cycles. Thus, new single level cells (SLC) and multi-level cell devices have significantly increased bit error rate (BER), decreasing the reliability of the device.

Flash devices are typically organized into physical pages. Each page contains a section allocated for data (typically 512 bytes-4 Kbytes) and a small number of bytes (typically 16-32 bytes for every 512 data bytes) containing redundancy and management information. The redundancy bytes are used to store error correcting information, for correcting errors which may have occurred during the page program or page read. Each Read and Program operation is typically performed on an entire page. A number of pages are grouped together to form an Erase Block (EB). A page typically cannot be erased unless the entire EB which contains it is erased.

An important factor of flash memory cost is the proportion of space allocated to "spare bits", especially redundant information used to correct read errors e.g. due to retention. The ratio between the number of redundancy bits to the number of data bits is called the code rate.

The code rate is chosen according to the flash memory bit error rate or the number of error bits per page. The code rate is always less than the capacity bound that can be computed for each error probability. As shown in FIG. 2, the erasure channel capacity is always greater than the binary channel, so using erasure coding to correct the program errors is much more powerful than using conventional error correction code. Conventional error correction code, such as BCH or Reed-Solomon, corrects random errors during a read operation and lacks knowledge of the errors' locations.

Erasure coding use verifies procedure information to detect exactly the error bits' locations and to encode them. An example described below illustrates use of 15 bits of redundancy for 2 Kbyte page to correct up to 7 errors by using erasures whereas conventional error correction code allows correction of only a single error. The term "erasure" refers to a dummy logical value assigned to a symbol to indicate that it is unclear which logical value is best to assign, e.g. because the physical level read from the cell which the symbol represents is intermediate to adjacent logical values such as 110 and 111. The term "erasure coding" refers to the addition of redundancy ("erasure code") to a codeword to enable the codeword to be properly decoded even though it includes at least one erasure.

Certain embodiments of the present invention seek to provide a flash memory system in which a page being programmed is read immediately after programming to detect immediate errors and construct parity bits according to error location. The term "immediate errors" is intended to include data errors which occur, hence can be identified and taken into account, as the data is being written from a still existing temporary memory, as opposed to errors which occur only after the temporary memory from which the data has been copied, no longer exists.

The following terms may be construed either in accordance with any definition thereof appearing in the prior art literature or in accordance with the specification, or as follows:

Bit error rate (BER)=a parameter that a flash memory device manufacturer commits to vis a vis its customers, expressing the maximum proportion of wrongly read bits (wrongly read bits/total number of bits) that users of the flash memory device may expect at any time during the stipulated lifetime of the flash memory device e.g. 10 years.

Block=a set of flash memory device cells which must, due to physical limitations of the flash memory device, be erased together. Also termed erase sector, erase block.

Cell: A component of flash memory that stores one bit of information (in single-level cell devices) or n bits of information (in a multi-level device having 2 exp n levels). Typically, each cell comprises a floating-gate transistor. n may or may not be an integer. "Multi-level" means that the physical levels in the cell are, to an acceptable level of certainty, statistically partitionable into multiple distinguishable regions, plus a region corresponding to zero, such that digital values each comprising multiple bits can be represented by the cell. In contrast, in single-level cells, the physical levels in the cell are assumed to be statistically partitionable into only two regions, one corresponding to zero and one other, non-zero region, such that only one bit can be represented by a single-level cell.

Charge level: the measured voltage of a cell which reflects its electric charge.

Cycling: Repeatedly writing new data into flash memory cells and repeatedly erasing the cells between each, two writing operations.

Decision regions: Regions extending between adjacent decision levels, e.g. if decision levels are 0, 2 and 4 volts respectively, the decision regions are under 0 V, 0 V-2 V, 2 V-4 V, and over 4 V.

Demapping: basic cell-level reading function in which a digital n-tuple originally received from an outside application is derived from a physical value representing a physical state in the cell having a predetermined correspondence to the digital n-tuple.

Digital value or "logical value": n-tuple of bits represented by a cell in flash memory capable of generating 2 exp n distinguishable levels of a typically continuous physical value such as charge, where n may or may not be an integer.

Erase cycle: The relatively slow process of erasing a block of cells (erase sector), each block typically comprising more than one page, or, in certain non-flash memory devices, of erasing a single cell or the duration of so doing. An advantage of erasing cells collectively in blocks as in flash memory, rather than individually, is enhanced programming speed: Many cells and typically even many pages of cells are erased in a single erase cycle.

Erase-write cycle: The process of erasing a block of cells (erase sector), each block typically comprising a plurality of pages, and subsequently writing new data into at least some of them. The terms "program" and "write" are used herein generally interchangeably.

Flash memory: Non-volatile computer memory including cells that are erased block by block, each block typically comprising more than one page, but are written into and read from, page by page. Includes NOR-type flash memory, NAND-type flash memory, and PRAM, e.g. Samsung PRAM, inter alia, and flash memory devices with any suitable number of levels per cell, such as but not limited to 2, 4, or 8.

Mapping: basic cell-level writing function in which incoming digital n-tuple is mapped to a program level by inducing a program level in the cell, having a predetermined correspondence to the incoming logical value.

Physical Page=A portion, typically 512 or 2048 or 4096 bytes in size, of a flash memory e.g. a NAND or NOR flash memory device. Writing and reading is typically performed physical page by physical page, as opposed to erasing which can be performed only erase sector by erase sector. A few bytes, typically 16-32 for every 512 data bytes are associated with each page (typically 16, 64 or 128 per page), for storage of error correction information. A typical block may include 32 512-byte pages or 64 2048-byte pages.

Precise read, soft read: Cell threshold voltages are read at a precision (number of bits) greater than the number of Mapping levels ($2^n$). The terms precise read or soft read are interchangeable. In contrast, in "hard read", cell threshold voltages are read at a precision (number of bits) smaller than the number of Mapping levels ($2^n$ where n=number of bits per cell).

Present level, Charge level: The amount of charge in the cell. The Amount of charge currently existing in a cell, at the present time, as opposed to "program level", the amount of charge originally induced in the cell (i.e. at the end of programming).

Program: same as "write".

Program level (programmed level, programming level): amount of charge originally induced in a cell to represent a given logical value, as opposed to "present level".

Reprogrammability (Np): An aspect of flash memory quality. This is typically operationalized by a reprogrammability parameter, also termed herein "Np", denoting the number of times that a flash memory can be re-programmed (number of erase-write cycles that the device can withstand) before the level of errors is so high as to make an unacceptably high proportion of those errors irrecoverable given a predetermined amount of memory devoted to redundancy. Typically recoverability is investigated following a conventional aging simulation process which simulates or approximates the data degradation effect that a predetermined time period e.g. a 10 year period has on the flash memory device, in an attempt to accommodate for a period of up to 10 years between writing of data in flash memory and reading of the data therefrom.

Resolution: Number of levels in each cell, which in turn determines the number of bits the cell can store; typically a cell with 2^n levels stores n bits. Low resolution (partitioning the window, W, of physical values a cell can assume into a small rather than large number of levels per cell) provides high reliability.

Retention: of original physical levels induced in the flash memory cells despite time which has elapsed and despite previous erase/write cycles; retention is typically below 100% resulting in deterioration of original physical levels into present levels.

Retention time: The amount of time that data has been stored in a flash device, typically without, or substantially without, voltage having been supplied to the flash device i.e. the time which elapses between programming of a page and reading of the same page.

Symbol: Logical value

Threshold level: the voltage (e.g.) against which the charge level of a cell is measured. For example, a cell may be said to store a particular digital n-tuple D if the charge level or other physical level of the cell falls between two threshold values T.

Dummy charge level: a charge level which does not represent an n-tuple of logical data Retention noise: read errors generated by degradation of data due to length of retention in flash memory and/or previous write-erase cycles, as opposed to known errors.

Known errors: Immediate errors, such as but not limited to read errors generated by erratic over-programming also termed "erratic over-programming noise", as opposed to retention noise.

Code rate: ratio of data bits to data and redundancy bits in flash memory.

Data cells: cells storing data provided by host as opposed to "non-data cells" which do not store host-provided data, and may, for example, store instead error correction information, management information, redundancy information, spare bits or parity bits.

Logical page: a set of bits defined as a page typically having a unique page address, by a host external to a flash memory device.

Spare bits: Redundancy information, or all non-data information including management information.

Reliability: Reliability of a flash memory device may be operationalized as the probability that a worst-case logical page written and stored in that device for a predetermined long time period such as 10 years will be successfully read i.e. that sufficiently few errors, if any, will be present in the physical page/s storing each logical page such that the error code appended to the logical page will suffice to overcome those few errors.

In this specification, the terms "decision levels" and "threshold levels" are used interchangeably. "Reliably storing" and "reliable" are used to indicate that certain information is stored with high reliability in the sense that the information can be expected to be read without error throughout the guaranteed lifetime of the flash memory device.

There is thus provided, in accordance with at least one embodiment of the present invention, a flash memory system comprising temporary memory, writing apparatus for writing first logical data from the temporary memory into flash memory cells having at least two levels, thereby to generate a physical representation of the first logical data including known errors, reading apparatus for reading the physical representation from the cells, thereby to generate, and store in the temporary memory, second logical data which, if read immediately, is identical to the first logical data other than the known errors; and controlling apparatus controlling the writing apparatus and the reading apparatus and including known error ID apparatus operative to identify the known errors by comparing the first logical data to second logical data read immediately after the physical representation is generated, to store information characterizing the known errors and to use the information, when the second logical data is next read, to correct the known errors.

Also in accordance with at least one embodiment of the present invention, the information enables addresses of the known errors to be reconstructed when the second logical data is next read and wherein the controlling apparatus is operative to reconstruct the addresses, using the information, when the second logical data is next read.

Further in accordance with at least one embodiment of the present invention, the information comprises addresses of the known errors.

Still further in accordance with at least one embodiment of the present invention, the information comprises an earmark on each, cell containing at least one known error and correct logical data for each cell bearing an earmark.

Further in accordance with at least one embodiment of the present invention, the earmark comprises a dummy physical level assigned to the cell.

Still further in accordance with at least one embodiment of the present invention, the information comprises the total number of known errors identified by the known error ID apparatus and a serial number of a set comprising the addresses of the known errors, within a sequence, having a predetermined order, of all possible sets of the addresses of the known errors given the total number of known errors.

Further in accordance with at least one embodiment of the present invention, at least a portion of the controlling apparatus resides in a microcontroller within a flash memory device within which the cells reside.

Still further in accordance with at least one embodiment of the present invention, at least a portion of the controlling apparatus resides in a controller external to a flash memory device within which the cells reside.

Additionally in accordance with at least one embodiment of the present invention, the cells comprise NAND cells or NOR cells.

Further in accordance with at least one embodiment of the present invention, the addresses comprise bit addresses or symbol addresses.

Also provided, in accordance with at least one embodiment of the present invention, is a flash memory system comprising a multiplicity of flash memory cells; reading apparatus; writing apparatus for writing logical data from temporary memory into individual flash memory cells from among the multiplicity of flash memory cells, thereby to generate a physical representation of the logical data including a plurality of physical levels at least some of which represent, to the reading apparatus, at least one bit-worth of the logical data; and special cell marking apparatus operative to earmark at least an individual one of the multiplicity of flash memory cells for subsequent special treatment.

Further in accordance with at least one embodiment of the present invention, the special cell marking apparatus is operative to earmark the individual one of the multiplicity of cells by assigning a dummy physical level assigned to the cell wherein the dummy physical level is characterized in that it does not represent logical data to the reading apparatus.

Additionally provided, in accordance with at least one embodiment of the present invention, is a method for storing a set of at least one consecutive integers in memory, the method comprising computing and storing at least one serial number identifying at least one respective position of at least one consecutive integer in the set respectively in a predetermined sequence of all possible addresses; and computing the at least one consecutive integer from the at least one serial number.

Further in accordance with at least one embodiment of the present invention, the set of at least one consecutive integers comprises at least one address.

Still further in accordance with at least one embodiment of the present invention, the address comprises a flash memory cell address.

Also provided, in accordance with yet a further embodiment of the present invention, is a flash memory utilization method comprising writing first logical data from temporary memory into flash memory cells having at least two levels, thereby to generate a physical representation of the first logical data including known errors; reading the physical representation from the cells, thereby to generate, and store in the temporary memory, second logical data which, if read immediately, is identical to the first logical data other than the known errors; and controlling the writing apparatus and the reading apparatus including identifying the known errors by comparing the first logical data to second logical data read immediately after the physical representation is generated, storing information characterizing the known errors and using the information, when the second logical data is next read, to correct the known errors.

Additionally provided, in accordance with at least one embodiment of the present invention, is a flash memory utilization method comprising writing logical data from temporary memory into individual flash memory cells from among a multiplicity of flash memory cells, thereby to generate a physical representation of the logical data including a plurality of physical levels at least some of which represent, to reading apparatus, at least one bit-worth of the logical data; and special cell marking apparatus operative to earmark at least an individual one of the multiplicity of flash memory cells for subsequent special treatment.

According to one embodiment of the present invention, a program, verify and erasure coding method is provided in which some or all of the following steps are performed in any suitable order such as but not limited to the following: programming data only (page without parity bits), verifying including detecting the error bits and erratic over-programming, storing at least one error address in temporary memory such as SRAM, generating erasure data e.g. as described herein with reference to FIG. 5 or 6, encoding the data and erasure bits using error correction code and obtaining the parity bits, and programming of the erasure and parity bits. In contrast, conventionally, a page of data and parity bits is programmed, followed by verification.

According to one embodiment of the present invention, a method for erasure coding which utilizes an additional level is provided, in which some or all of the following steps are performed in any suitable order such as but not limited to the following: encoding the page, such that result=data+parity, programming the page, verifying that the cell level is between the lower and upper values, and if not (e.g. due to erratic over-programming), increase the cell voltage to an erasure level.

Any suitable processor, display and input means may be used to process, display, store and accept information, including computer programs, in accordance with some or all of the teachings of the present invention, such as but not limited to a conventional personal computer processor, workstation or other programmable device or computer or electronic computing device, either general-purpose or specifically constructed, for processing; a display screen and/or printer and/or speaker for displaying; machine-readable memory such as optical disks, CDROMs, magnetic-optical discs or other discs; RAMs, ROMs, EPROMs, EEPROMs, magnetic or optical or other cards, for storing, and keyboard or mouse for accepting. The term "process" as used above is intended to include any type of computation or manipulation or transformation of data represented as physical, e.g. electronic, phenomena which may occur or reside e.g. within registers and/or memories of a computer.

The above devices may communicate via any conventional wired or wireless digital communication means, e.g. via a wired or cellular telephone network or a computer network such as the Internet.

The apparatus of the present invention may include, according to certain embodiments of the invention, machine readable memory containing or otherwise storing a program of instructions which, when executed by the machine, implements some or all of the apparatus, methods, features and functionalities of the invention shown and described herein. Alternatively or in addition, the apparatus of the present invention may include, according to certain embodiments of the invention, a program as above which may be written in any conventional programming language, and optionally a machine for executing the program such as but not limited to a general purpose computer which may optionally be configured or activated in accordance with the teachings of the present invention.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of a computer or computing system, or processor or similar electronic computing device, that manipulate and/or transform data represented as physical, such as electronic, quantities within the computing system's registers and/or memories, into other data similarly represented as physical quantities within the computing system's memories, registers or other such information storage, transmission or display devices.

The embodiments referred to above, and other embodiments, are described in detail in the following sections.

BRIEF DESCRIPTION OF THE DRAWINGS

Certain embodiments of the present invention are illustrated in the following drawings.

DETAILED DESCRIPTION OF CERTAIN EMBODIMENTS OF THE PRESENT INVENTION

Figure 11:
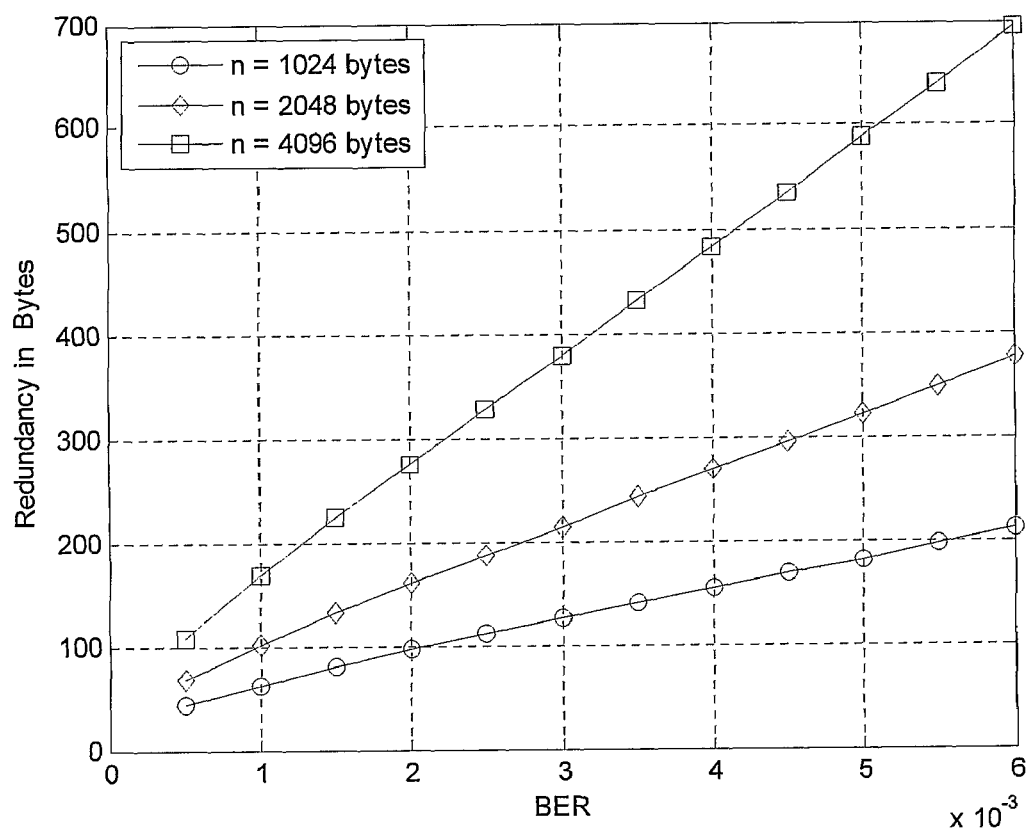
FIG. 11 is a redundancy vs. bit error rate graph useful in implementing some of the embodiments shown and described herein.

According to certain embodiments of the present invention, the code rate is selected in the flash design stage. Experiments are performed in the course of which the bit error rate may be measured and the code rate computed e.g. as shown in FIG. 11. FIG. 11 illustrates a redundancy allocation per any bit error rate for a given page size. Conventional programming may include several steps e.g. as shown and described below including incremental injection of charge into the flash. The charge monotonically increases until the cell voltage reaches the pre-defined target value.

In technologies in which the charge can only increase, some cell voltages may overshoot their intended targets due to a random process known as erratic over-programming (EOP). It is appreciated however that certain embodiments of the present invention are described below in terms of erratic over-programming merely for simplicity, their applicability now being limited to applications in which erratic over-programming is actually occurring.

Figure 1A:
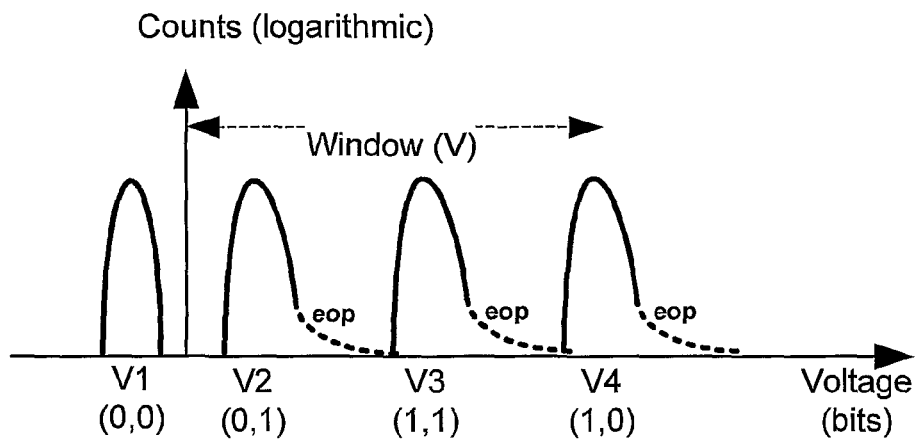
FIG. 1A is a logarithmic-scale graph of distributions of voltage levels within flash memory cells suffering from erratic over-programming (EOP)
Figures 3, 4A, 4B:
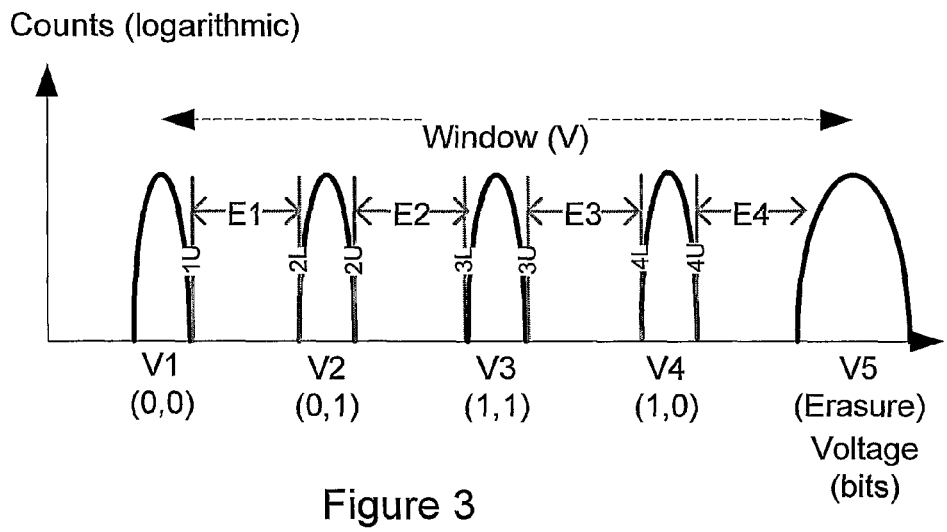
FIG. 3 is a logarithmic-scale graph of distributions of voltage levels within theoretical flash memory cells which do not suffer from erratic overprogramming.
FIGS. 4A and 4B are prior art subsequence-symbol tables.

Erratic over-programming causes errors in the stored data. These errors are an example, but not the only example, of errors which, fortunately, may be detected immediately after the programming procedure ends in accordance with certain embodiments of the present invention. In FIG. 1A, erratic over-programming manifests itself as a long tail, indicated in dashed lines, on the right of the cell voltage distribution. FIG. 3, in contrast, is a theoretical illustration of how the distribution might appear in the absence of erratic over-programming. FIG. 1A too is not necessarily accurate in its parameters and is merely intended to illustrate the concept of erratic over-programming.

Figure 7:
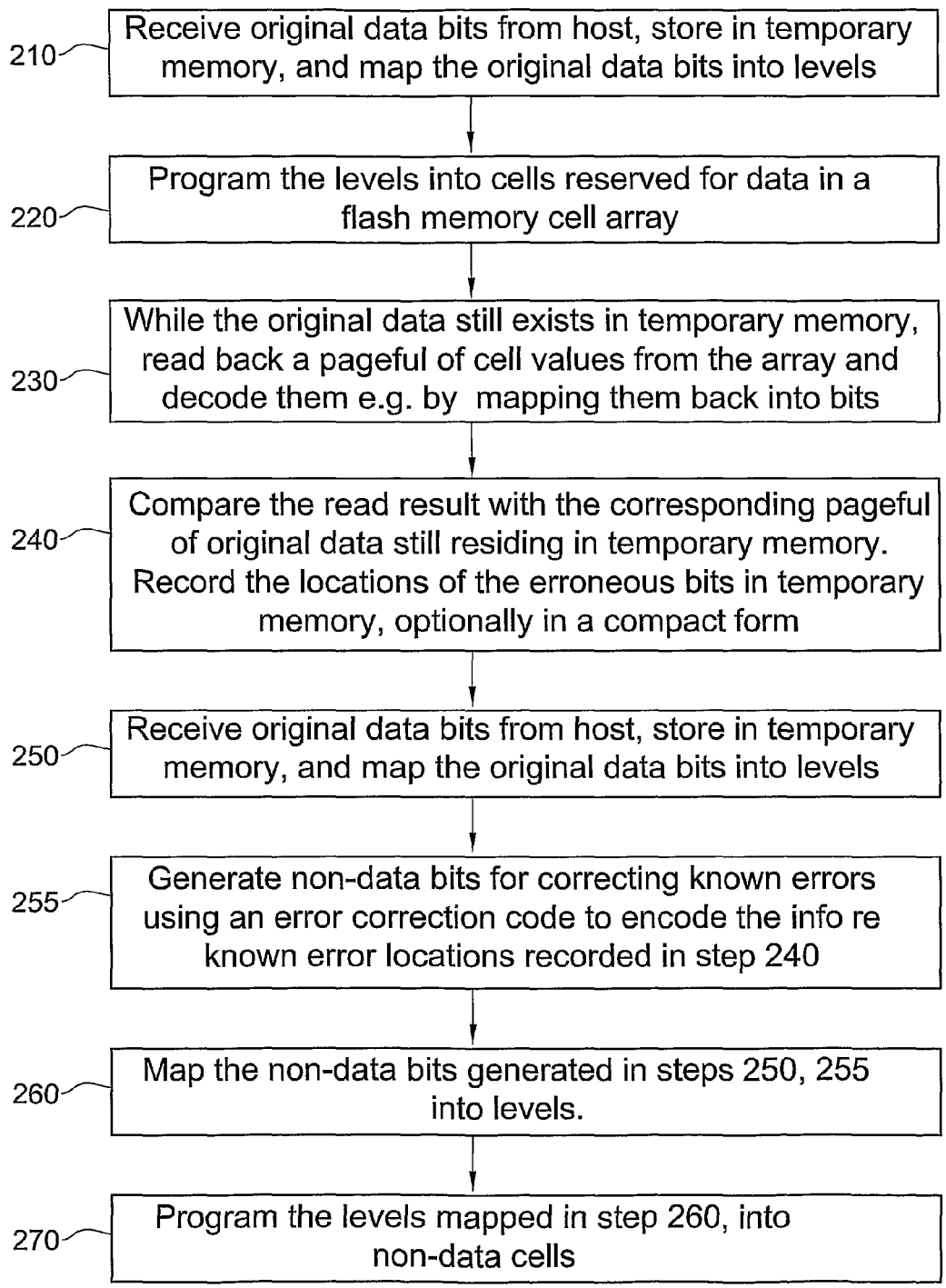
FIG. 7 is a simplified flowchart illustration of a first method for erratic over-programming coding, constructed and operative in accordance with certain embodiments of the present invention, which uses a verify-read operation to generate known error characterizing information re cells which suffered from erratic over-programming.

The errors during program operation can be detected immediately if a verify-read operation 230 is instituted following the page program operation 220, as shown in FIG. 7. The verify-read operation 230 is typically executed between successive repetitions of program steps 220 in order to learn the exact voltage value of the cell during the programming procedure. During the programming operation a cell voltage typically cannot be restored to a lower value, however, the verify-read information may be employed to construct code that corrects program errors.

Certain embodiments of the present invention employ program/verify and error correction to improve the flash programming quality. During normal programming operation some cells experience erratic over-programming. Both erratic over-programming noise and retention noise degrade the flash quality and generate read errors. Conventional error correction does not distinguish between the erratic over-programming and retention noise which are treated as a single read noise source. The flash suffers from aging as a result of program/erase cycles and retention time. The aging process results in loss of window size and increase in noise variance of each program level e.g. each of the four programming levels V1, . . . , V4 in FIG. 1A. The consequence may be loss in the signal to noise ratio and increase in number of error bits.

In order to encode information and to protect it against errors, redundancy information is typically appended to the original data. A bit (or symbol) sequence representing data (typically a pageful of data) and redundancy is termed herein a "codeword". A "code rate" of a codeword may be the ratio between the number of bits (or symbols) in the codeword which serve to store data, and the total number of bits (or symbols) in the codeword which may for example be 1024 Bytes to 4096 Bytes. A bit may flip to the wrong value with probability p.

Figure 2:
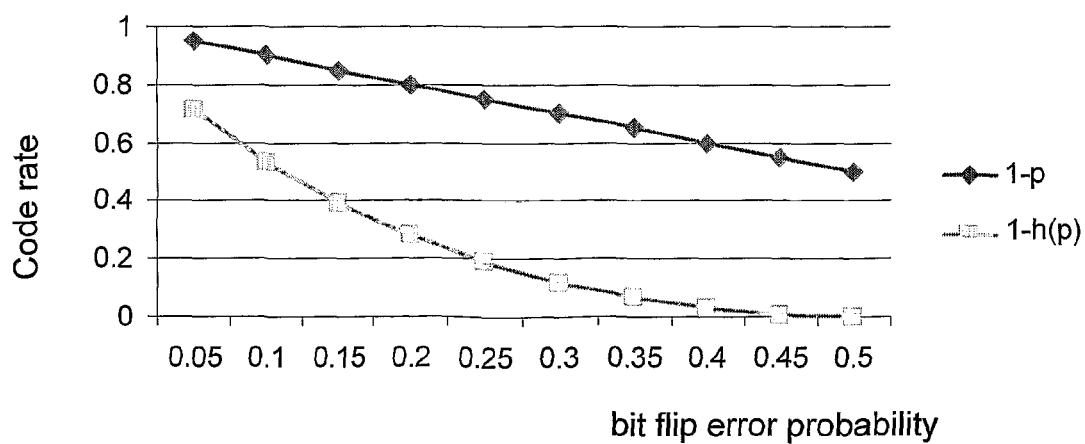
FIG. 2 is a code rate vs. bit flip error probability graph showing a rate of erasure in a top graph and a binary channel in a bottom graph.

The bottom curve in FIG. 2 shows the maximum code rate achievable assuming there is no prior information on which bit flips and how many such bits there are. The top curve in FIG. 2 shows the maximum rate achievable if it is known which bits are suspicious and if such bits are marked as erasures so as to indicate that they may be either 0 or 1, with equal probability. As is apparent from FIG. 2, more density can be obtained from the flash if locations of erratic over-programming errors are recorded and erratic over-programming noise removed, using coding in accordance with any embodiment of the present invention. Advantages of these embodiments may include one or both of the following:

a. Narrowing of the program symbol regions (voltage distributions), e.g. removal of the erratic over-programming tail. (A "symbol" is an n-tuple of bits in a logical page, represented by a discrete charge level on a physical page. For example: '00'=V0, '01'=V1, '10'=V2 and '11'=V3 are 4 symbol/charge level relationships); and b. Use of erasure coding to encode erratic over-programming cells.

According to one embodiment of the present invention, e.g. as shown in FIG. 1A, erratic over-programming is detected following a programming procedure and a sequence of bits (or symbols) may be allocated which represents the locations where erratic over-programming occurred. The sequence is then typically appended or stored separately (e.g. in redundancy symbols).

A second embodiment, as shown in FIG. 3, is to allocate an additional program level which will be denoted as an erasure level at each program symbol. The erasure symbols may be denoted by the top program level. The locations of erratic over-programming are then marked by doing a second programming procedure which raises the program levels of the erratic over-programming locations to the top level. FIG. 3 is an example of a case of a multi-level cell with 4 program levels and one erasure level marked as V5. More generally, a region between any two program levels may be deemed an erasure region. The program window may be divided into multiple erasure regions interspersed with multiple symbol regions figures shown in FIG. 3. In FIG. 3, by way of example, there are four erasure regions marked E1, E2, E3 and E4. The levels are tuned according to the erasure coding capability. If a specific cell's programmed level lies in the erasure region above it, or in any of the regions above that, the cell may be marked as erasure.

In the verify operation the erratic over-programming may be detected. By using the lower and upper verify level for each symbol, a cell which has moved beyond the lower or upper limits can be detected. If so the program erasure may be moved in the next step. If an erratic over-programming bit is detected, its physical value may be increased to the dummy value (V5 in the illustrated embodiment) which indicates that the cell suffers from erratic over-programming error.

Once marked by either erasures or in a separate sequence as described in detail below, a second code may be applied to both parts of the data (i.e. the data part and the erasure part), thereby protecting the information against additional errors due to retention. As a result, the programming errors are eliminated and more errors may be corrected compared with conventional error correction methods.

Figure 1B:
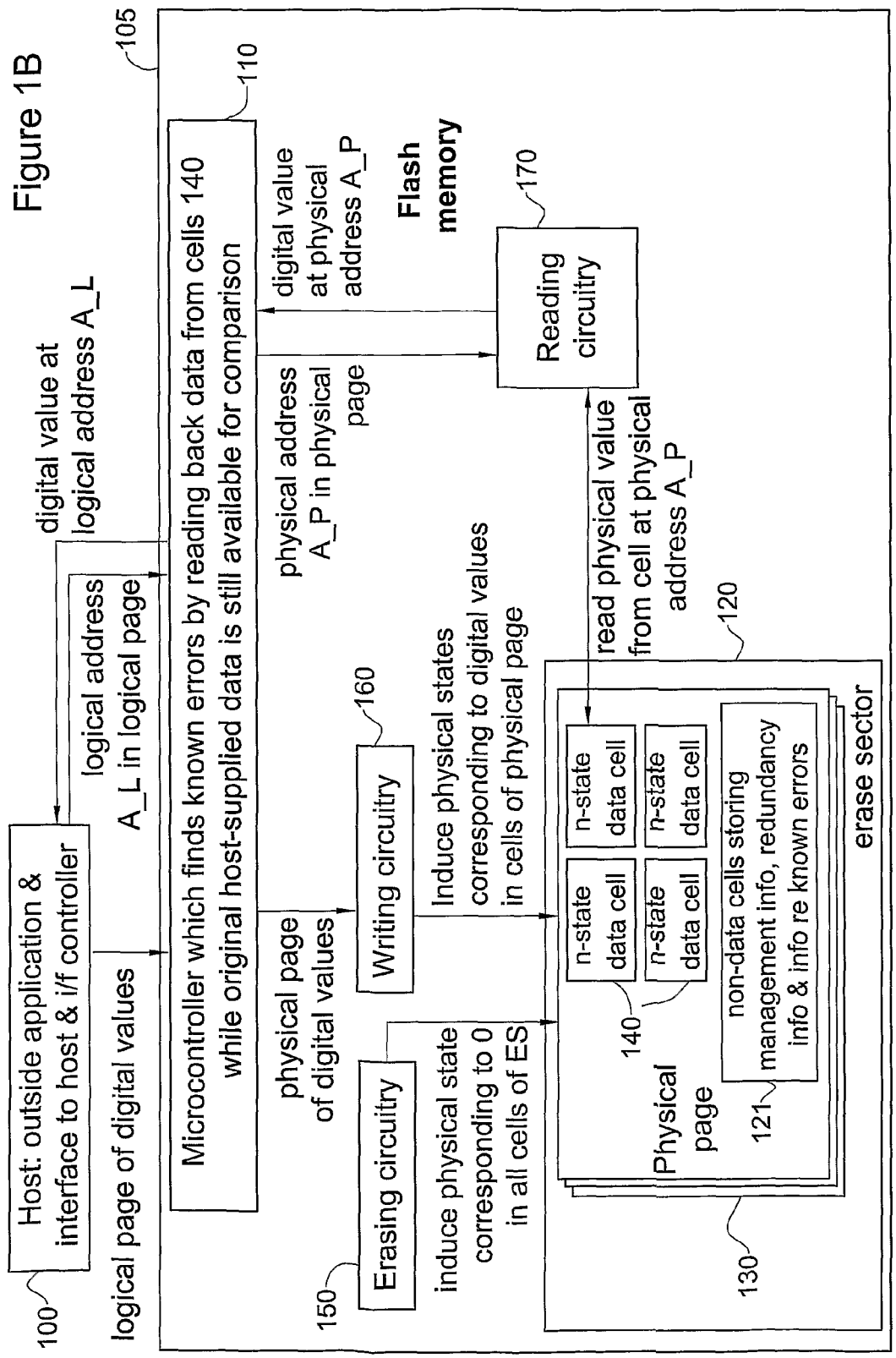
FIG. 1B is a simplified block diagram illustration of a flash memory system constructed and operative in accordance with a first embodiment of the present invention.

FIG. 1B is a simplified functional block diagram of a flash memory system constructed and operative, in accordance with a first embodiment of the present invention, to identify and rectify data errors which occur while the temporary memory from which the data was read, still exists. As shown, the system of FIG. 1C includes a host 100 interfacing with a flash memory device 105 including a microcontroller 110 (some or all of whose functions may alternatively be performed by an external microcontroller connected between the flash memory and the host), and one or more erase sectors 120 each having one or more physical pages 130 each of which comprises a plurality of data cells 140 as well as non-data cells 121. Also included is erasing circuitry 150, writing circuitry 160 and reading circuitry 170. The microcontroller 110 finds known errors by reading back data from cells 140 while original host-supplied data is still available for comparison. The non-data cells 121 are operative to store management info, redundancy info and information re known errors. It is appreciated that some or all of the functionality of the microcontroller 110 can be provided in fact by an external controller instead.

Figure 1C:
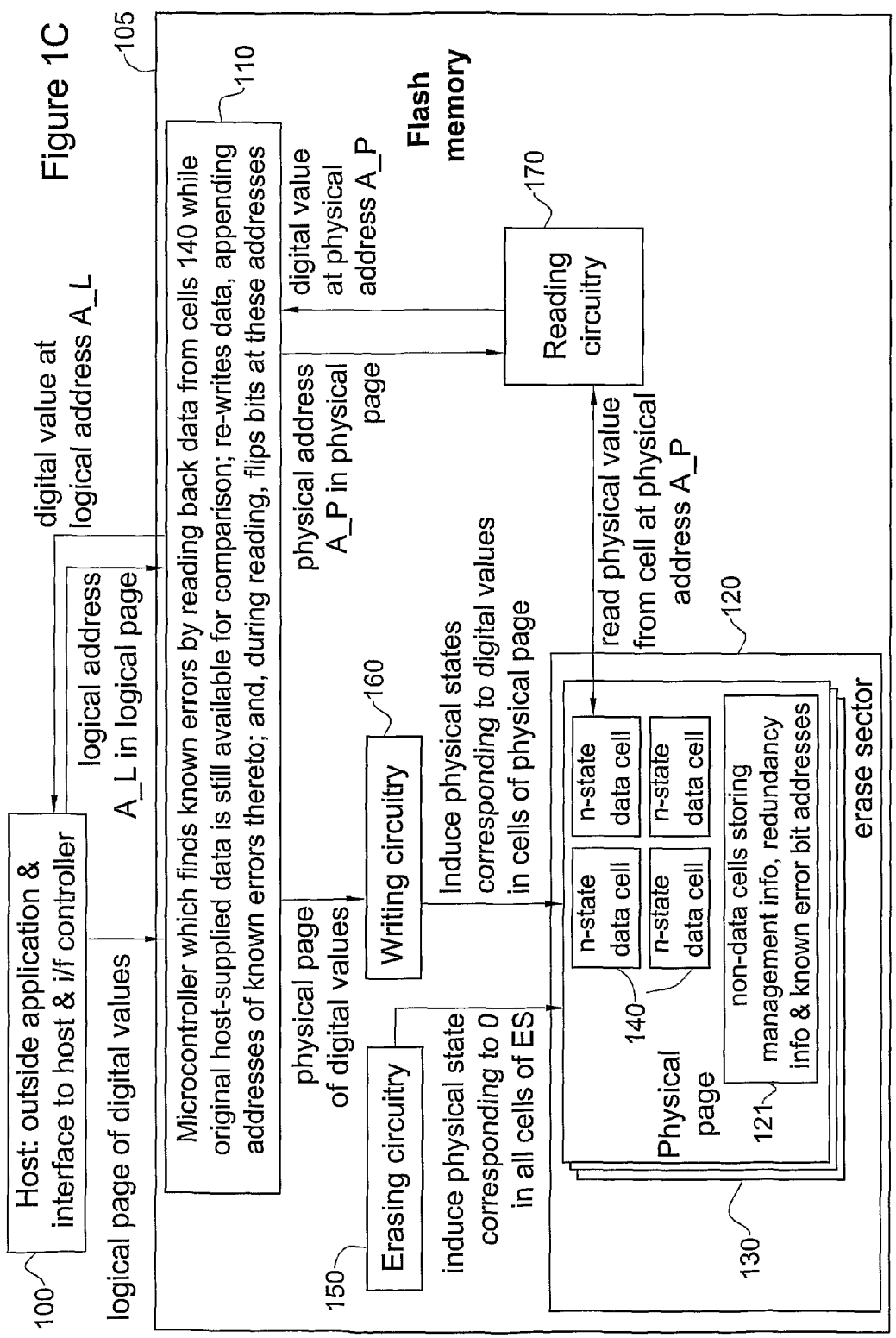
FIG. 1C is a simplified block diagram illustration of a flash memory system constructed and operative in accordance with a second embodiment of the present invention.
Figure 1D:
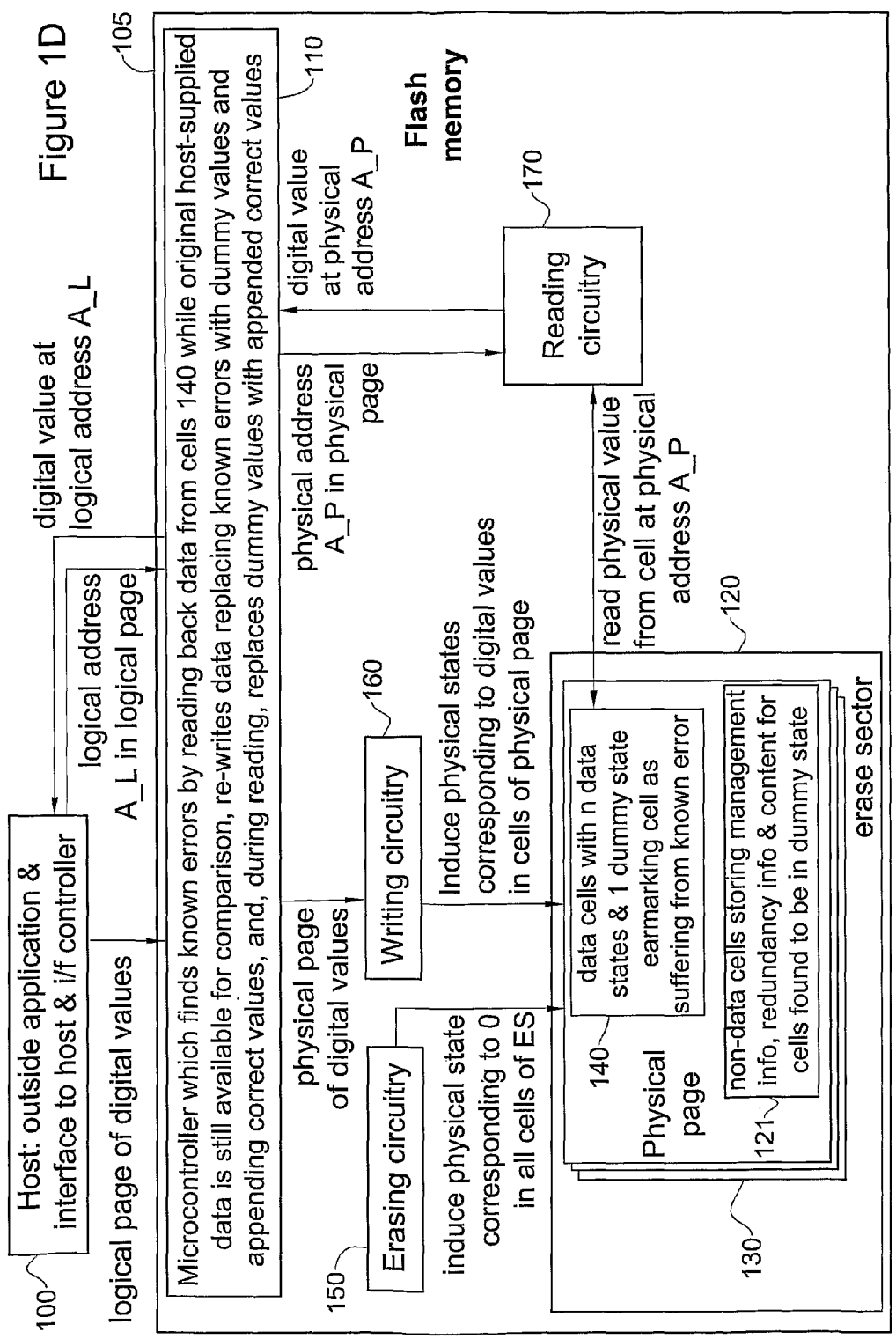
FIG. 1D is a simplified block diagram illustration of a flash memory system constructed and operative in accordance with a third embodiment of the present invention.

FIG. 1C is a simplified functional block diagram of a flash memory system constructed and operative, in accordance with a second embodiment of the present invention, to identify and rectify data errors which occur while the temporary memory from which the data was read, still exists. In the embodiment of FIG. 1D, the microcontroller 110, or an external controller, finds known errors by reading back data from cells 140 while original host-supplied data is still available for comparison. The controller also typically re-writes data, appending addresses of known errors thereto; and, during reading, flips bits at these addresses, all as described in detail below with reference to FIGS. 7-8. In this embodiment, non-data cells 121 typically store management information, redundancy information and known error bit addresses.

FIG. 1D is a simplified functional block diagram of a flash memory system constructed and operative, in accordance with a third embodiment of the present invention, to identify and rectify data errors which occur while the temporary memory, from which the data was read, still exists. In the embodiment of FIG. 1D, the microcontroller 110, or an external controller, finds known errors by reading back data from cells 140 while original host-supplied data is still available for comparison, re-writes data replacing known errors with dummy values and appending correct values, and, during reading, replaces dummy values with appended correct values. Non-data cells 121 typically store management info, redundancy info and content for cells found to be in dummy state, all as described in detail below with reference to FIGS. 9-10. In this embodiment, the data cells 140 have n data states plus one additional dummy state earmarking cell as suffering from known error.

A first embodiment of erratic over-programming coding, as illustrated in FIG. 7, uses a verify-read operation 230 to generate known error characterizing information re cells which suffered from erratic over-programming. Locations of these cells may be encoded, preferably as compactly as possible, and stored in the redundancy area of the page along with additional typically conventional error correction information. The error correction information may be generated from the erroneous page and the encoded erratic over-programming cell locations. A second programming procedure 270, may be then performed to program the redundancy cells. In this embodiment, no erasure regions are provided between programming levels.

The method of FIG. 7 typically includes some or all of the following steps in a suitable order e.g. as shown:

Step 210: Receive original data bits from host, store in temporary memory, and map the original data bits into levels. The mapping process converts n bits into 2^n levels, e.g. 2 bits per cell are converted to 4 levels to be program. This process may be done by applying Grey coding e.g. as shown in FIG. 4A for the case of 8 levels.

Step 220: Program the levels into cells reserved for data in a flash memory cell array Step 230: while the original data still exists in temporary memory, read back a pageful of cell values from the array and decode them e.g. by mapping them back into bits.

Step 240: Compare the read result with the corresponding pageful of original data still residing in temporary memory. Record the locations of the erroneous bits in temporary memory, optionally in a compact form. It may be possible to store the locations, or to store the first locations followed by the intervals between each two adjacent locations, or to use any other suitable method for compactly storing the location information such as the method of FIG. 5.

Step 250: generate non-data bits for correcting retention errors using an error correction code to decode the data read from the device (which may include erratic over-programming errors)

Step 255: generate non-data bits for correcting known errors using an error correction code to encode the info re known error locations recorded in step 240

Step 260: Map the non-data bits generated in steps 250, 255 into levels Step 270: Program the levels mapped in step 260, into non-data cells Typically, according to the method of FIG. 7, the page is programmed in two sections (steps 220 and 270), first the data without parity then the erasure index and parity. If additional level coding is used, programming may occur in a single step (data and parity), since the erasure index may be programmed with the additional level.

Figure 8:
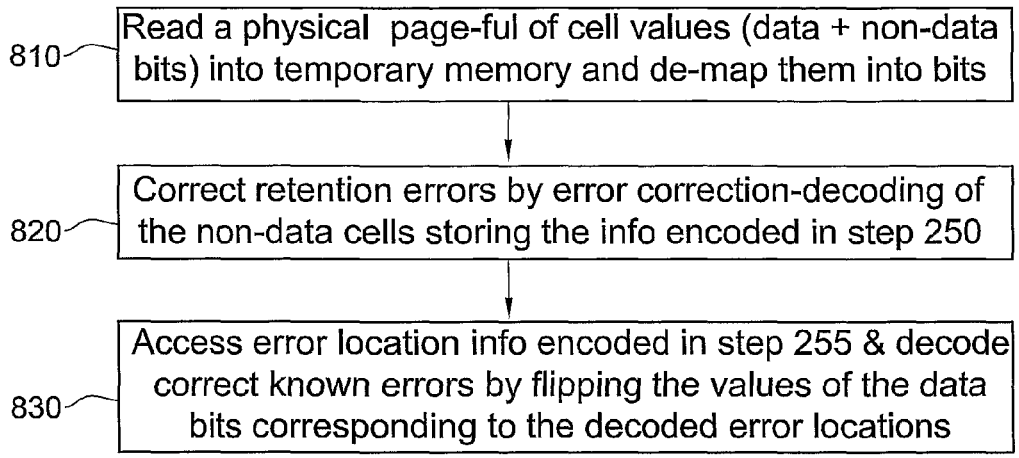
FIG. 8 is a simplified flowchart illustration of a method, constructed and operative in accordance with certain embodiments of the present invention, for reading a page programmed as per the method of FIG. 7.

A suitable method for reading a page programmed as per the method of FIG. 7 is illustrated in FIG. 8. As shown, the method of FIG. 8 may include some or all of the following steps, suitably ordered e.g. as shown:

Step 810: Read a physical page-full of cell values (data+ non-data bits) into temporary memory and de-map them into bits.

Step 820: correct retention errors by error correction-decoding of the non-data cells storing the info encoded in step 250 (typically also correcting thereby, errors that occurred due to erratic over-programming in the programming of the redundancy. Since parity may be programmed in the second step it might be corrupted with erratic over-programming. So in the decoding step the entire page is typically corrected including the erratic over-programming errors in the parity bits.

Step 830: Access error location info encoded in step 255 & decode (e.g. using the method of FIG. 6 if locations were encoded using the method of FIG. 6) correct known errors by flipping the values of the data bits corresponding to the decoded error locations.

Figure 5:
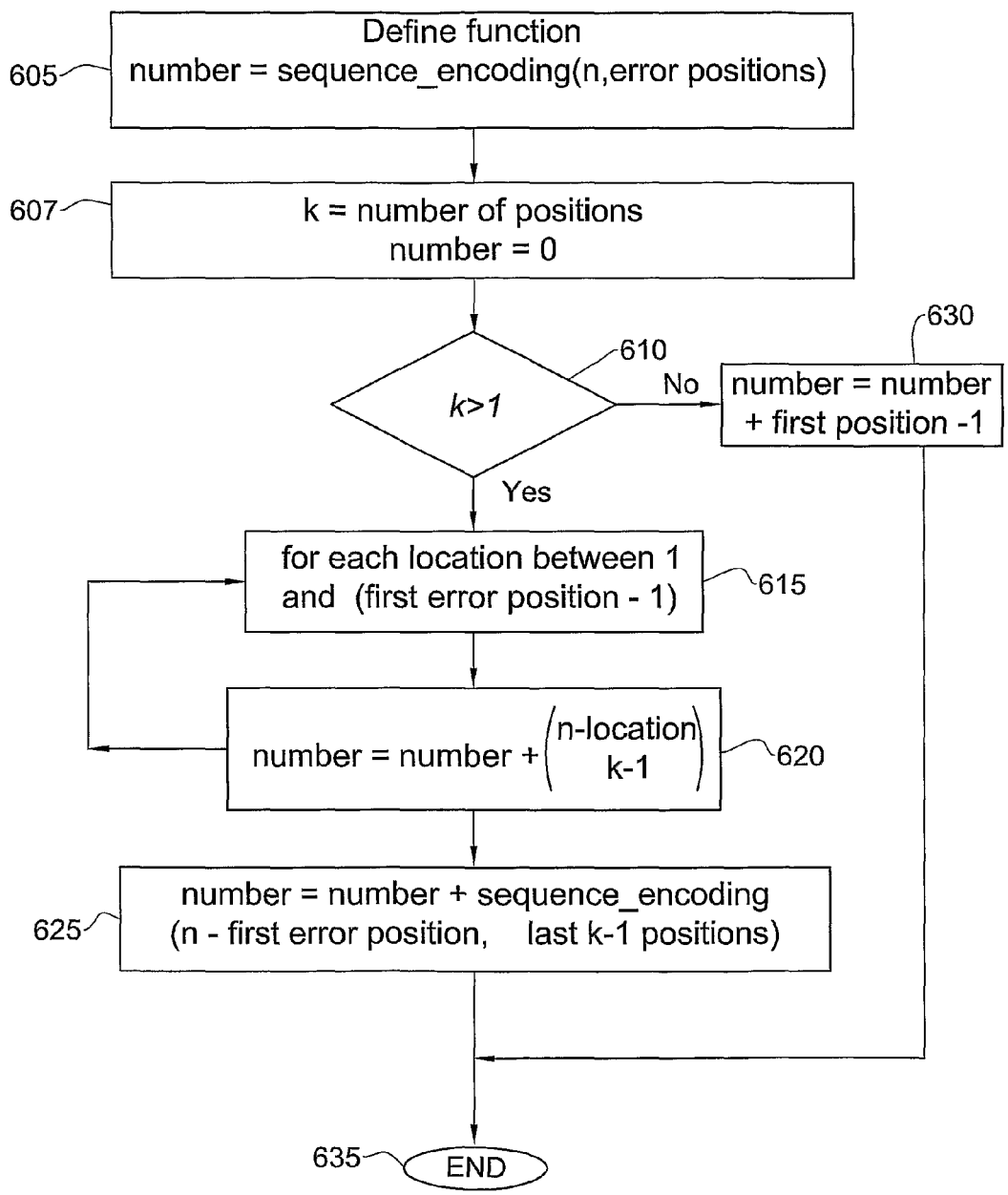
FIG. 5 is a simplified flowchart illustration of a recursive method for compact encoding of erratic over-programming error locations constructed and operative in accordance with certain embodiments of the present invention which is suitable for performing the corresponding encoding step of FIG. 7.
Figure 6:
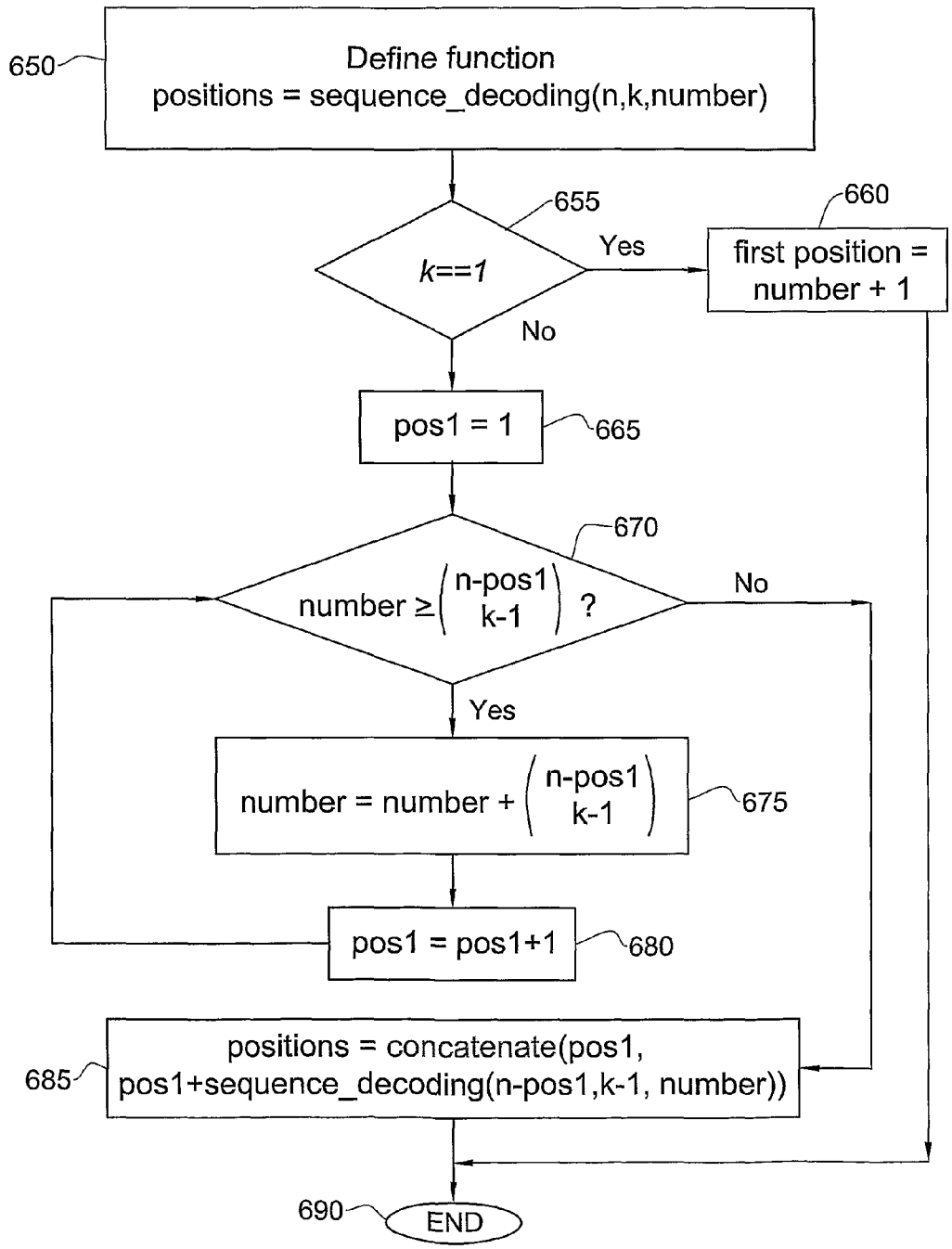
FIG. 6 is a simplified flowchart illustration of a recursive method, constructed and operative in accordance with certain embodiments of the present invention, for decoding erratic over-programming error locations encoded as per the method of FIG. 5, the method being suitable for performing the corresponding decoding step of FIG. 8.

Reference is now made to FIG. 5 which illustrates a recursive method, including a recursive step 625, for compact encoding of erratic over-programming error locations suitable for performing step 240 of FIG. 7. FIG. 6 illustrates a recursive method, including a recursive step 685, for decoding erratic over-programming error locations encoded as per the method of FIG. 5 and is suitable for performing step 830 of FIG. 8.

These methods achieve near optimum encoding. Let k denote the number of locations and let n be the number of bits (or symbols) in the original data sequence. There are exactly $$\binom{n}{k} = \frac{n!}{k!(n-k)!}$$

possible sequences of k out of n error locations. Therefore, at least $$\left\lceil \log_2 \binom{n}{k} \right\rceil$$

bits are employed to encode a sequence. First, k bits are encoded. If k<K, $\lceil \log_2 K \rceil$ bits may be reserved for this, where K may be any integer greater than k. Next, encode the sequence of k out of n locations, typically in a compact form employing $$\left\lceil \log_2 \binom{n}{k} \right\rceil$$

bits.

In order to encode the sequence of k out of n locations, a serial number may be assigned to each ordered set of k possible locations between 0 and $$\binom{n}{k} - 1.$$

This serial number may be then presented as a binary number; since the correspondence between serial number and ordered set of locations is known, the ordered set of locations can be retrieved. This may be done in a recursive manner. Assume the location of the first error is 1. There are then $$\binom{n-1}{k-1}$$

ways to define all possible k−1 locations of the remaining possible n−1 locations. Therefore, to encode a sequence of k out of n locations in which the first location is 1, these sequences may be numbered between 0 and $$\binom{n-1}{k-1} - 1.$$

If the first location was not 1 but 2, there are $$\binom{n-2}{k-1}$$

ways to define all possible k−1 locations of the possible (left) n−2 locations. Therefore, to encode a sequence of k out of n locations in which the first location is 2, these sequences are numbered between $$\binom{n-1}{k-1} \text{ and } \binom{n-1}{k-1} + \binom{n-2}{k-1} - 1.$$

$$\binom{n-1}{k-1}$$

may be added to the numbers to distinguish these cases from the case in which the first error was found in the first location.

This procedure may be repeated iteratively until the first location is found and recursively to give the precise number of k−1 numbers out of n−v numbers where v is the location of the first error.

In summary, a compact and perhaps the most compact way to store a subset of cell locations, from among an original data sequence stored in n cell locations, which are special in some sense (e.g. in the sense that the cell locations in the subset suffer from known errors) comprises the following procedure as shown in FIG. 5: storing the number (k) of such cell locations in the redundancy bits, converting each possible set of cell locations into a cell location sequence having a predetermined order, typically increasing order of address, and arranging all possible cell location sequences in a known order, thereby to define a sequence of all possible selections of k cell locations from among the total number, n, of cell locations. If this is done, it may be sufficient to store the serial number of the particular set of known error locations within the sequence; from this and from the known number k of cell locations, the known error locations can be derived e.g. as per the method of FIG. 6.

For example, there may be k=5 cells with known errors in a flash memory physical page containing a total of n=1024 cells. The addresses of these cells may be 1, 6, 100, 457 and 900. There are 1024!/5!(1024−5)!=9291,185,992,704 different ordered sets of 5 addresses in total which may be selected from 1024 cells, of which (1, 6, 100, 457 and 900) is but one example. These 1024!/5!(1024−5)! ordered sets of addresses may be arranged in the following known order: (1, 2, 3, 4, 5); (1, 2, 3, 4, 6); . . . (1, 2, 3, 4, 1024); (1, 2, 3, 5, 6); (1, 2, 3, 5, 7); . . . (1, 2, 3, 5, 1024); . . . (1, 2, 3, 1022, 1023); (1, 2, 3, 1022, 1024); (1, 2, 3, 1023, 1024); (1, 2, 4, 5, 6) . . . , . . . , (1, 2, 4, 1023, 1024); . . . (1, 2, 1022, 1023, 1024); (1, 3, 4, 5, 6) . . . (1, 3, 1022, 1023, 1024); . . . ; . . . ; (1, 1021, 1022, 1023, 1024); (2, 3, 4, 5, 6) . . . (2, 3, 4, 5, 1024); . . . ; . . . ; (2, 3, 1022; 1023, 1024); (2, 1021; 1022; 1023; 1024); . . . (1020; 1021; 1022; 1023; 1024), thereby to form a sequence of all possible selections of 5 ordered cell addresses from among 1024 addresses total. Using the method of FIG. 5, it may be determined that the serial number ("number") of (1, 6, 100, 457 and 900) in the above sequence of selected sets of 5 addresses, is 575,218,469. To retrieve (1, 6, 100, 457 and 900), plug n=1024, k=5, number=575,218,469 into the method of FIG. 6.

The erratic over-programming encoding method of FIG. 7 may be modified by encoding only the symbols in which erratic over-programming errors occurred instead of the bits in which they occurred. Thus, only k out of n' symbol locations may be encoded, where n' is defined by n/log 2L and where L is the number of levels programmed per cell. Thus, fewer bits may be employed to encode the error locations.

In the erratic over-programming correction process it can typically be assumed that errors occur only in one direction. That is, typically, one may mistakenly program a higher level than is appropriate (e.g. V4 instead of V3) whereas one never programs a lower level than the appropriate level (e.g. V3 instead of V4), since a too-low level is raised one level higher. Thus, once it is known that a certain location contains an error, the output read level may be decreased by 1 with respect to the level actually read.

The following example explains how the method of FIG. 6 enhances compactness of flash memory. Consider an example where 16384 bits of data are programmed on a multi-level cell flash containing 3 bits per cell (i.e. 8 levels per cell). Correct n1=50 erratic over-programming errors+n2=5 errors which occur due to retention. Using the method of FIG. 7, encode at least the 16384th bit over 5462 cells. To encode n1=50 locations out of 5462 possible locations using, e.g., the method of FIG. 6, $$\lceil \log_2 50 \rceil + \left\lceil \log_2 \binom{5462}{50} \right\rceil = 413$$

bits are employed.

A binary BCH code, say, may be used to protect against the retention errors. This code encodes both the data read from the device (with the erratic over-programming errors) and the 413 bits encoding up to 50 erratic over-programming error locations. Such a BCH code would employ 16×5=80 redundancy bits. Therefore, a total of 493 bits may be used. This outcome may be compared with a conventional code that does not distinguish between erratic over-programming errors and retention errors hence may be operative to correct 55 errors. If BCH code is used, this would employ 55*16=880 bits of redundancy. This is almost twice the redundancy provided in the above example of usage of the method of FIG. 7.

Figure 9:
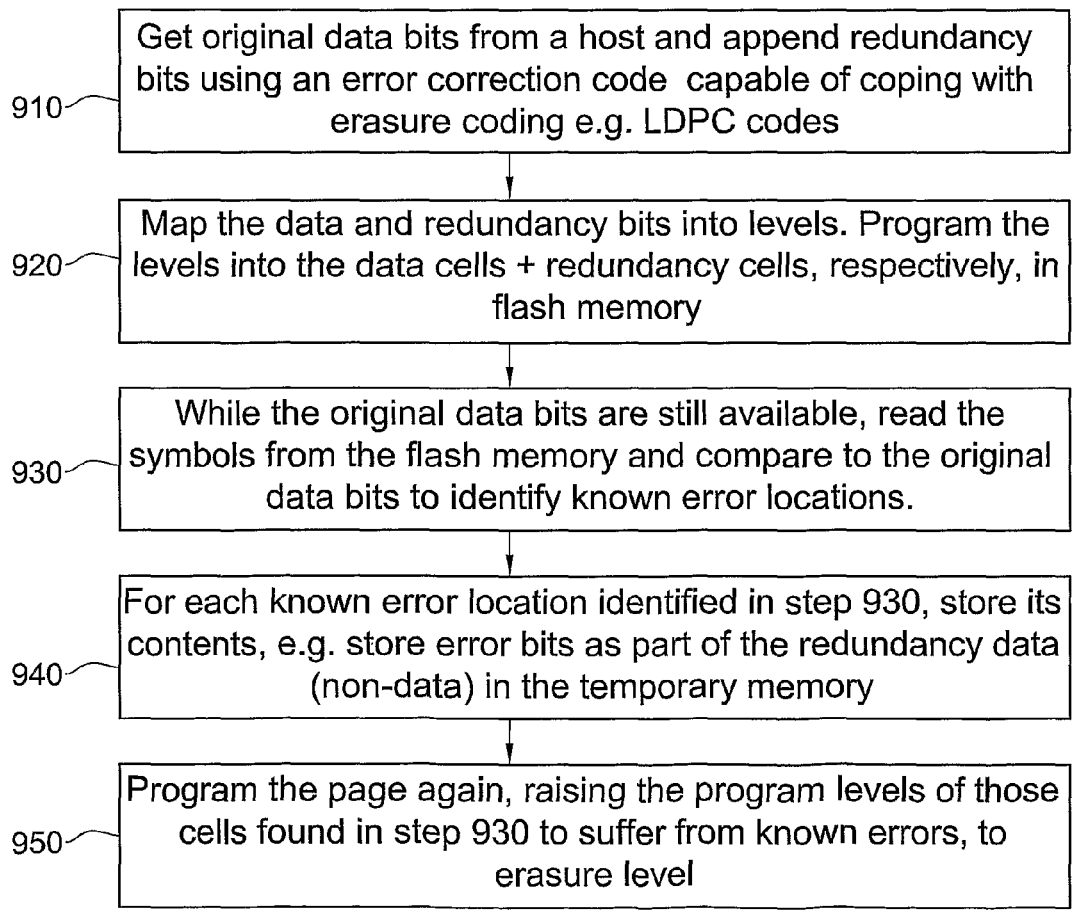
FIG. 9 is a simplified flowchart illustration of a second method for erratic over-programming coding, constructed and operative in accordance with certain embodiments of the present invention.
Figure 10:
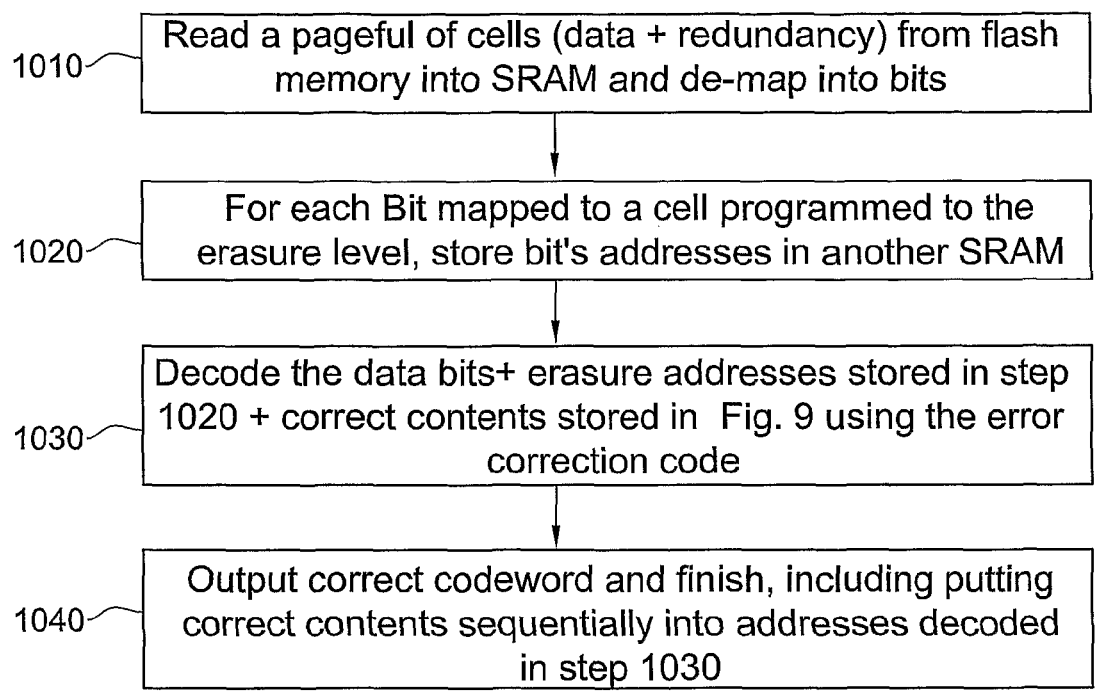
FIG. 10 is a simplified flowchart illustration of a decoding method, constructed and operative in accordance with certain embodiments of the present invention, which corresponds to the coding method of FIG. 9.

A second method for erratic over-programming coding is now described with reference to FIG. 9. The corresponding decoding method is shown in FIG. 10. In FIG. 9, instead of encoding the erratic over-programming error locations, the cells that suffered from erratic over-programming are marked within the cells themselves e.g. by programming the cells to the highest programming level which may be especially reserved for this purpose and is referred to as the erasure level. For example, FIG. 3 illustrates 5 bell curve distributions of 5 charge levels respectively, in a 2-bit-per-cell flash memory device. The fifth level may be reserved for erasure.

In step 910, the original data is programmed with redundancy which contains parity bits. The parity bits are generated by an error correction encoder which is designed to address erasures. An example of such an encoder is a Low Density Parity Check (LDPC) encoder which is known in the art (e.g. in Modern Coding Theory, T. Richardson and R. Urbanke, Cambridge University Press, Chapter 3, page 77) as especially suitable for erasure. Thus low redundancy may be provided to facilitate erasure correction, as shown in FIG. 2. The encoder may also be used to correct a small number of errors which are not marked as erasures and which are due to retention.

Step 940 identifies which of the cells were over-programmed. Step 950 marks the over-programmed cells by raising their programming level to the highest one (e.g. V5 in FIG. 3). It is appreciated that once a level is over-programmed it cannot be lowered to the correct value. Lowering levels can only be effected in the course of an erase operation and only on multiple pages simultaneously.

In summary, the encoding process of FIG. 9 typically comprises some or all of the following steps, suitably ordered e.g. as shown:

Step 910: Get original data bits from a host and append redundancy bits using an error correction code capable of coping with erasure coding e.g. LDPC codes Step 920: Map the data and redundancy bits into levels (e.g. using the table of FIG. 4A or the table of FIG. 4B). Program the levels into the data cells+redundancy cells, respectively, in flash memory Step 930: while the original data bits are still available (e.g. in temporary memory), read the symbols from the flash memory and compare to the original data bits to identify known error locations.

Step 940: for each known error location identified in step 930, store its contents, e.g. store error bits as part of the redundancy data (non-data) in the temporary memory Step 950: Program the page again, raising the program levels of those cells found in step 930 to suffer from known errors, to erasure level and programming the additional error bits as part of the redundancy data stored in the temporary memory.

The decoding process of FIG. 10 typically comprises some or all of the following steps, suitably ordered e.g. as shown:

Step 1010: Read a pageful of cells (data+redundancy) from flash memory into SRAM and de-map into bits.

Step 1020: for each Bit mapped to a cell programmed to the erasure level, store bit's addresses in another SRAM Step 1030: Decode the data bits+erasure addresses stored in step 1020+correct contents stored in FIG. 9 using the error correction code.

Step 1040: Output correct codeword and finish, including putting correct contents sequentially into addresses decoded in step 1030

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on-board the flash array or otherwise incorporated therewithin. Examples of flash memory arrays include Samsung's K9XXG08UXM series, Hynix' HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Example of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly the error correction code and NAND interface components.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order.

The invention claimed is:

1. A system comprising:
a temporary memory;
a writing apparatus for writing first logical data from said temporary memory into flash memory cells having at least two levels, thereby to generate a physical representation of the first logical data including known errors;
a reading apparatus for reading said physical representation from the cells, thereby to generate, and store in said temporary memory, second logical data which if read immediately is identical to said first logical data other than said known errors; and
a controlling apparatus controlling said writing apparatus and said reading apparatus, wherein the controlling apparatus is operative to identify said known errors by comparing said first logical data to second logical data read immediately after said physical representation is generated, to store information characterizing said known errors and to use said information, when said second logical data is next read, to correct said known errors; wherein said information comprises (a) multiple earmarks, each earmark is stored in a cell containing at least one known error, and (b) correct logical data for each cell storing an earmark.

2. The system according to claim 1 wherein said information enables addresses of said known errors to be reconstructed when said second logical data is next read and wherein said controlling apparatus is operative to reconstruct said addresses, using said information, when said second logical data is next read.

3. The system according to claim 1 wherein said information does not comprise an address field.

4. The system according to claim 1 wherein said earmark comprises a dummy physical level assigned to the cell.

5. The system according to claim 1 wherein at least a portion of said controlling apparatus resides in a microcontroller within a flash memory device within which said cells reside.

6. The system according to claim 1 wherein at least a portion of said controlling apparatus resides in a controller external to a flash memory device within which said cells reside.

7. The system according to claim 1 wherein the system is arranged to program the multiple earmark into a cell that contained a known error after detecting all the known errors in the flash memory cells.

8. The system according to claim 1 wherein at least two different earmarks have values that belong to different erasure regions, the erasure regions differ from symbol regions.

9. A system comprising:
temporary memory;
writing apparatus for writing first logical data from said temporary memory into flash memory cells having at least two levels, thereby to generate a physical representation of the first logical data including known errors;
reading apparatus for reading said physical representation from the cells, thereby to generate, and store in said temporary memory, second logical data which if read immediately is identical to said first logical data other than said known errors; and
controlling apparatus controlling said writing apparatus and said reading apparatus, the controlling apparatus is operative to identify said known errors by comparing said first logical data to second logical data read immediately after said physical representation is generated, to store information characterizing said known errors and to use said information, when said second logical data is next read, to correct said known errors;
wherein said information enables addresses of said known errors to be reconstructed when said second logical data is next read and wherein said controlling apparatus is operative to reconstruct said addresses, using said information, when said second logical data is next read;
wherein said information comprises a total number of known errors to be identified by the controlling apparatus and a serial number of a set comprising the addresses of the known errors, within a sequence, having a predetermined order, of all possible sets of the addresses of the known errors given the total number of known errors.

10. The system according to claim 9 wherein said information comprises addresses of said known errors.

11. The system according to claim 9 wherein said addresses comprise bit addresses.

12. The system according to claim 9 wherein said addresses comprise symbol addresses.

13. A method for storing a set of integers that comprises a certain number of integers in memory, the method comprising:
computing and storing at least one serial number identifying at least one respective position of the set of integers in a predetermined sequence of all possible sets of integers that comprise the certain number of integers, wherein each integer of each set has a value within a predetermined range; and
computing at least one integer from the set of integers from said at least one serial number.

14. The method according to claim 13 wherein said set of integers comprises at least one address; and wherein the predetermined range is a predetermined range of addresses.

15. The method according to claim 14 wherein said at least one address comprises at least one flash memory cell address.

16. A flash memory utilization method comprising:
writing first logical data from temporary memory into flash memory cells having at least two levels, thereby to generate a physical representation of the first logical data including known errors;
reading said physical representation from the cells, thereby to generate, and store in said temporary memory, second logical data which if read immediately is identical to said first logical data other than said known errors; and
controlling said writing apparatus and said reading apparatus, wherein the controlling comprises:
identifying said known errors by comparing said first logical data to second logical data read immediately after said physical representation is generated,
storing information characterizing said known errors; wherein said information comprises (a) multiple earmarks, each earmark is stored in a cell containing at least one known error, and (b) correct logical data for each cell storing an earmark; and
using said information, when said second logical data is next read, to correct said known errors.

* * * * *